United States Patent [19]

Yazawa et al.

[11] Patent Number: 4,916,500

[45] Date of Patent: Apr. 10, 1990

[54] MOS FIELD EFFECT TRANSISTOR DEVICE WITH BURIED CHANNEL

[75] Inventors: Yoshiaki Yazawa, Hitachi; Atsuo Watanabe, Hitachiota; Atsushi Hiraishi, Hitachi; Masataka Minami, Hitachi; Takahiro Nagano, Hitachi, all of Japan

[73] Assignee: Hitachi, Ltd., Tokyo, Japan

[21] Appl. No.: 78,987

[22] Filed: Jul. 29, 1987

[30] Foreign Application Priority Data

Jul. 31, 1986 [JP] Japan ................... 61-178889

[51] Int. Cl.$^4$ ................ H01L 29/78; H01L 29/90
[52] U.S. Cl. ................ 357/23.3; 357/23.8; 357/22; 357/23.12; 357/23.7; 357/13
[58] Field of Search ............ 357/23.3, 23.8, 23.12, 357/23.6, 23.7, 22, 13

[56] References Cited

U.S. PATENT DOCUMENTS

| | | | |
|---|---|---|---|
| 3,595,714 | 7/1971 | Thiré et al. | 357/22 |
| 4,000,504 | 12/1976 | Berger | 357/91 |
| 4,302,764 | 11/1981 | Fang et al. | 357/23.6 |
| 4,393,578 | 7/1983 | Cady et al. | 357/22 |
| 4,549,193 | 10/1985 | Malhi et al. | 357/22 |

FOREIGN PATENT DOCUMENTS

| | | | |
|---|---|---|---|
| 0137564 | 4/1985 | European Pat. Off. | 357/42 |
| 3138747 | 4/1983 | Fed. Rep. of Germany | 357/23.3 |
| 57-31177 | 2/1982 | Japan | 357/23.7 |
| 60-50960 | 3/1985 | Japan | 357/23.3 |
| 60-251669 | 12/1985 | Japan | 357/23.3 |

OTHER PUBLICATIONS

Ohwada et al., *IEEE Trans. on Elec. Dev.*, vol. ED-28, No. 9, Sep. 1981, pp. 1084–1087, "A High-Speed ... Layer".

Sunami et al., *IEEE Trans. on Elec. Dev.*, vol. ED-29, No. 4, Apr. 1982, "Characteristics ... MOS Device", pp. 607–610.

Primary Examiner—Andrew J. James
Assistant Examiner—Jerome Jackson, Jr.
Attorney, Agent, or Firm—Antonelli, Terry & Wands

[57] ABSTRACT

The present invention relates to a semiconductor device comprising a semiconductor substrate of a first conductivity type or an insulator, a source comprising an impurity layer of a second conductivity type disposed on said semiconductor substrate or said insulator, a drain comprising an impurity layer of the second conductivity type disposed on said semiconductor substrate or said insulator, an impurity layer of the first conductivity type formed between said source and said drain, a gate formed on said impurity layer of the first conductivity type via an insulation film, and an impurity layer of the second conductivity type having an impurity concentration lower than that of said source and said drain, said impurity layer of the second conductivity type being disposed between said source, said drain and said impurity layer of the first conductivity type, and said semiconductor substrate of the first conductivity type or said insulator.

10 Claims, 5 Drawing Sheets

MOS FIELD EFFECT TRANSISTOR DEVICE WITH BURIED CHANNEL

BACKGROUND OF THE INVENTION

The present invention relates to a MOSFET formed on a substrate, and in particular to a semiconductor device capable of operating at high speed and with high reliability and its fabrication method.

One of conventional techniques relating to the MOSFET is disclosed in Japanese Laid-Open Patent Publication No. 60-50960 (1985), for example. FIG. 1 shows the structure and energy band of a surface channel MOSFET based on such a conventional technique. The prior art will now be described by referring to FIG. 1. A p-type semiconductor substrate 1, an insulation layer 2, a gate 3, a source 4 and a drain 5 are illustrated in FIG. 1.

In a MOSFET of the prior art shown in FIG. 1A, the source 4 and the drain 5 comprising an n+ type semiconductor are disposed in the upper part of the p-type semiconductor substrate 1. On the surface of the above described semiconductor substrate between the source 4 and the drain 5, the gate 3 is disposed via the insulation layer 2. The energy band of this FET derived at a section C-C' of FIG. 1A when $V_{GS}$ which is equal to the threshold voltage $V_{th}$ is applied as the forward gate voltage is shown in FIG. 1B. That is to say, the energy level $E_c$ representing the bottom of the conduction band, the intrinsic Fermi level $E_i$, and the energy level $E_v$ at the top of the valence band are largely bent near the insulation layer 2 located under the gate 3 by the gate voltage $V_{GS}$. Accordingly, a channel is formed on the surface of the semiconductor substrate 1 immediately under the insulation layer 2. When the illustrated MOSFET is turned ON, therefore, the drain current is distributed so as to be concentrated to a range of several ten angstroms in depth from the surface of the semiconductor substrate 1.

As understood from the bend of the energy band shown in FIG. 1B, the above described MOSFET has a large electric field in a direction (longitudinal direction) perpendicular to the direction of the drain current. This electric field is maximized at the surface of the semiconductor substrate 1. Accordingly, such a prior art MOSFET has a problem in that the movement of electrons for letting flow the drain current, i.e., carriers are obstructed by the effect of the surface scattering and hence it is difficult to obtain a large drain current.

Another problem of this MOSFET of the prior art will now be described. As the size of the gate is decreased, the peak value of the electric field concentrated at the end of the drain under the gate becomes large. As a result of this electric field, carriers acquire sufficient high energy so as to get over the energy barrier between the semiconductor substrate 1 comprising silicon and its oxide film, resulting in hot carriers. The hot carriers enter into the insulation layer 2 comprising $SiO_2$. This results in a problem that the characteristics of the MOSFET are varied.

The above described MOSFET of the prior art has a further problem in that the withstand voltage between the source and drain is lowered when the size of the gate is reduced. This problem can be solved to some degree by raising the concentration of impurities of the substrate. In this case, however, the difference in concentration of impurities between the drain and the substrate is expanded to increase the electric field. This results in a problem that the avalanche breakdown voltage is lowered and degradation of device characteristics due to hot carrier injection is accelerated. Further, the capacitance between the source and the substrate and that between the drain and the substrate also increase, resulting in a problem of a lowered operation speed of the MOSFET.

SUMMARY OF THE INVENTION

An object of the present invention is to provide a MOSFET which is large in withstand amount of hot carriers and which is not much lowered in carrier mobility and concurrently provide a MOSFET having withstand voltage between the source and drain which is not much lowered even if the size of the gate is reduced and the fabrication method of such a MOSFET.

In accordance with a first feature of the present invention, a semiconductor device includes a semiconductor substrate of a first conductivity type or an insulator, a source comprising an impurity layer of a second conductivity type disposed on the semiconductor substrate or the insulator, a drain comprising an impurity layer of the second conductivity type disposed on the semiconductor substrate or the insulator, an impurity layer of the first conductivity type formed between the source and the drain, a gate formed on the impurity layer of the first conductivity type via an insulation film, and an impurity layer of the second conductivity type having an impurity concentration lower than that of the source and the drain, the impurity layer of the second conductivity type being disposed between the source, the drain and the impurity layer of the first conductivity type, and the semiconductor substrate of the first conductivity type or the insulator.

In accordance with a second feature of the present invention, a fabrication method of semiconductor device includes the steps of:

(1) forming an oxide film on the surface of a semiconductor substrate of a first conductivity type or on the surface of an insulator;

(2) forming an impurity layer by implanting impurity ions of a second conductivity type from the top of the oxide film into the substrate or the insulator;

(3) forming a polysilicon gate on the oxide film;

(4) forming a source and a drain by implanting impurity ions of the second conductivity type from the top of the gate with a higher concentration than that of the impurity layer; and (5) forming wiring for the source, the drain and the gate.

In accordance with the present invention, the above described object is attained by disposing a source and a drain respectively including semiconductor layers of a second conductivity type, disposing an impurity layer comprising a semiconductor of a first conductivity type between the source and the drain and under a gate, and disposing a semiconductor layer of the second conductivity type having an impurity concentration lower than that of the semiconductor of the second conductivity type constituting the source and the drain, under the source, the drain, and the impurity layer comprising the semiconductor of the first conductivity type.

When the MOSFET is turned off, the entire region of the semiconductor layer of the second conductivity type having a low impurity concentration is depleted to interrupt the drain current. When the MOSFET is turned on, a part of the semiconductor layer of the second conductivity type having a low impurity concentration remains as a neutral region under the impurity layer comprising the semiconductor layer of the first conductivity type. Therefore, the movement of carriers between the source and the drain is carried out through the neutral region. The concentration of the drain current onto the surface of the semiconductor substrate is thus prevented. As a result, it is possible to prevent the carrier mobility from being lowered and prevent the hot carriers from intruding into the gate insulation layer.

The impurity layer comprising the semiconductor of the first conductivity type disposed under the gate and between the source and the drain is able to have a high impurity concentration and high source-drain withstand voltage, because an inversion layer need not be formed on the surface unlike the conventional MOSFET. Because, the semiconductor layer of the second conductivity having a lower impurity concentration than that of the source and the drain is present between the source and drain and the substrate, the capacitance between the source and the substrate and the capacitance between the drain and the substrate can be reduced. As a result, the operation speed of the MOSFET is improved.

DESCRIPTION OF THE PREFERRED EMBODIMENT

An embodiment of a semiconductor device according to the present invention will now be described in detail by referring to drawings.

Figure 1A:
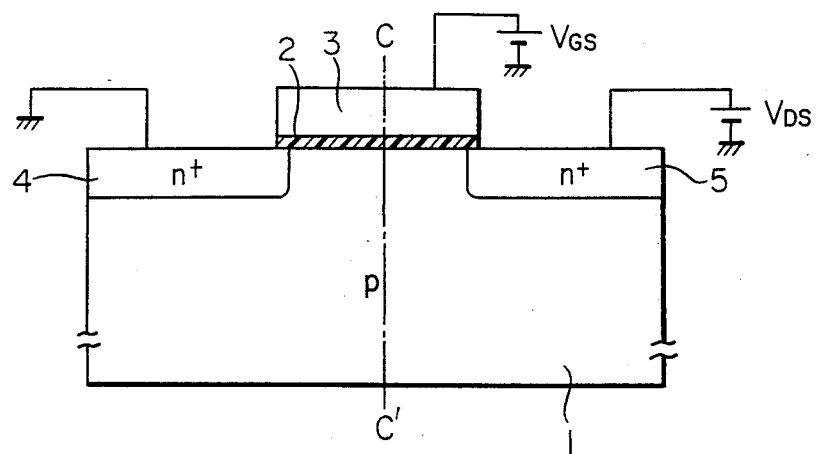
FIG. 1A shows the structure of a conventional MOSFET.
Figure 1B:
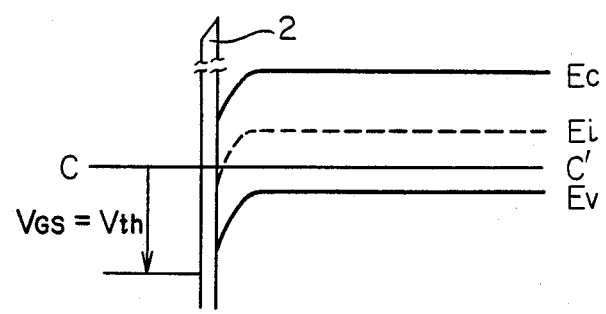
FIG. 1B shows the energy band at a section C–C' of FIG. 1A.
Figure 2:
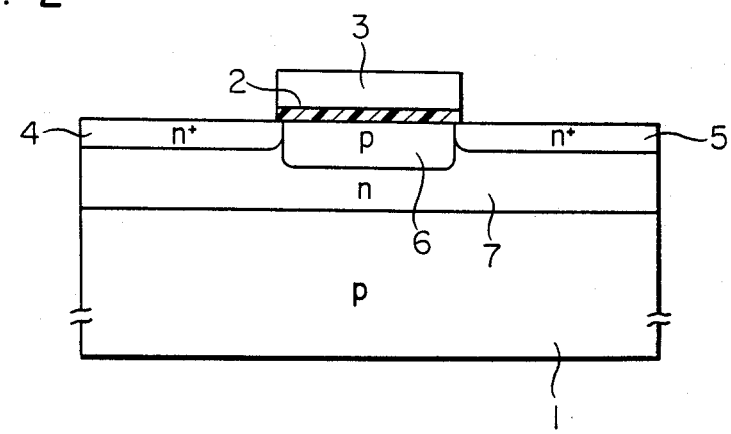
FIG. 2 shows the structure of an embodiment of MOSFET according to the present invention.
Figure 6:
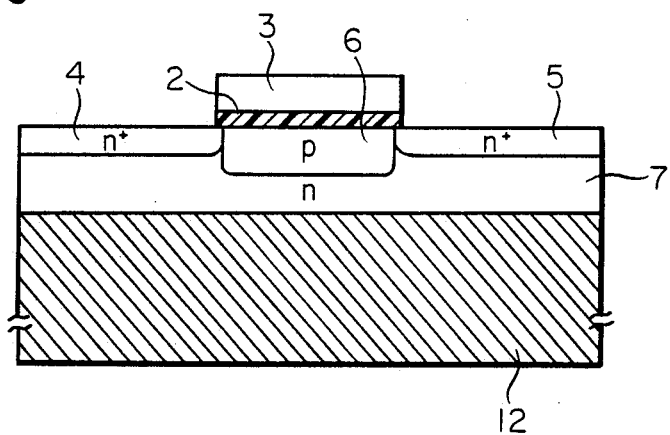
FIG. 6 shows the structure of a MOSFET according to another embodiment of the present invention.

FIG. 2 is a structure diagram of a MOSFET which is an embodiment of a semiconductor device according to the present invention. FIGS. 3A, 3B and 4A to 4D are drawings for illustrating the operation of the MOSFET according to the present invention. FIGS. 5A to 5F are drawings for illustrating the fabrication steps. FIG. 6 is a structure diagram of another embodiment of a MOSFET according to the present invention.

A p-type semiconductor substrate 1, an insulation layer 2, a gate 3, a source 4, a drain 5, a p-type impurity layer 6, an n-type impurity layer 7, a LOCOS film layer 8, electrodes 9, an insulation film 10 between layers, a passivation film 11, and an SOI substrate 12 are illustrated.

As shown in FIG. 2, the MOSFET according to the present invention includes a source 4 and a drain 5 formed by n-type impurity layers. The MOSFET also includes a p-type impurity layer 6 located under a gate 3 via an insulation layer and between the source 4 and the drain 5. Between a p-type semiconductor layer 1 and the source 4, the drain 5 and the p-type impurity layer 6, an n-type semiconductor layer 7 is disposed.

The impurity concentration of the n-type semiconductor layer 7 is lower than the impurity concentration of the n-type impurity layer constituting the source 4 and the drain 5.

Figure 3A:
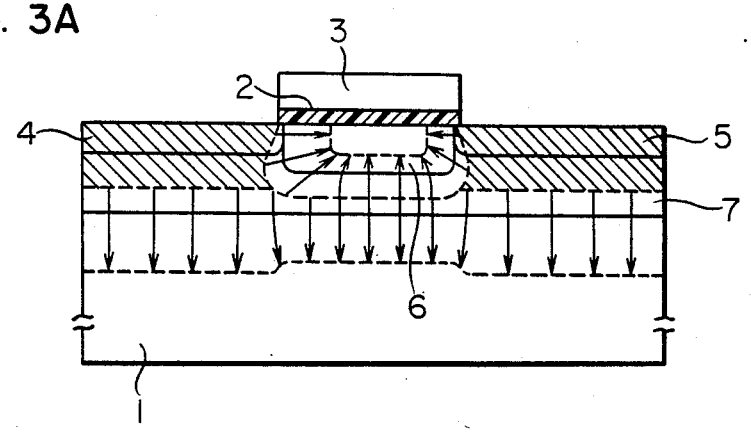
FIGS. 3A and 3B and FIGS. 4A to 4D are drawings for illustrating the operation of the MOSFET shown in FIG. 2.
Figure 3B:
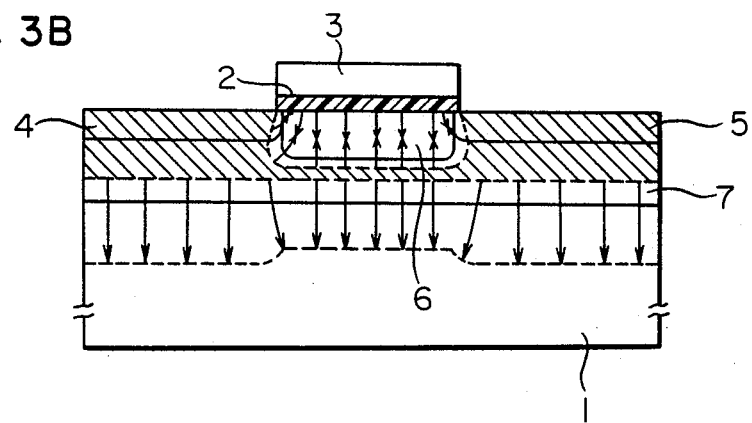

FIGS. 3A and 3B illustrate the operation of the MOSFET according to the present invention. In FIG. 3A, the MOSFET is in the OFF state. In FIG. 3B, the MOSFET is in the ON state. The shaded portion is an n-type neutral region serving as the current path. Arrows indicate the direction of the electric field and portions forming a depletion layer.

When the MOSFET according to the present invention is in the OFF state, a depletion layer extending from a pn junction formed between the p-type impurity layer 6 and the n-type impurity layer 7 and a depletion layer extending from a pn junction formed between the n-type impurity layer 7 and the p-type semiconductor substrate 1 are produced. As a result, the entire region of the n-type impurity layer 7 located under the gate 3 is depleted. Accordingly, the source 4 is interrupted from the drain 5 by this depletion layer, the drain current being prevented from flowing.

When the MOSFET according to the present invention is in the ON state, the n-type impurity layer 7 produces an neutral region under the gate 3 as shown in FIG. 3B. The reason can be explained as follows. By the application of positive voltage to the gate 3, a part of the charges within the p-type impurity layer 6 which have been combined with charges within the n-type impurity layer 7 is combined with charges within the gate electrode. Accordingly, the width of the depletion layer extending from the pn junction between the p-type impurity layer 6 and the n-type impurity layer 7 is reduced at the side of the n-type impurity layer 7. The above described neutral region is thus produced. By setting the impurity concentration and thickness of the p-type impurity layer 6, the n-type impurity layer 7 and the p-type semiconductor substrate 1, an n-type neutral layer can be formed in the n-type impurity layer 7 at a desired gate voltage. Accordingly, a drain current path through this neutral layer can be established.

Figure 4A:
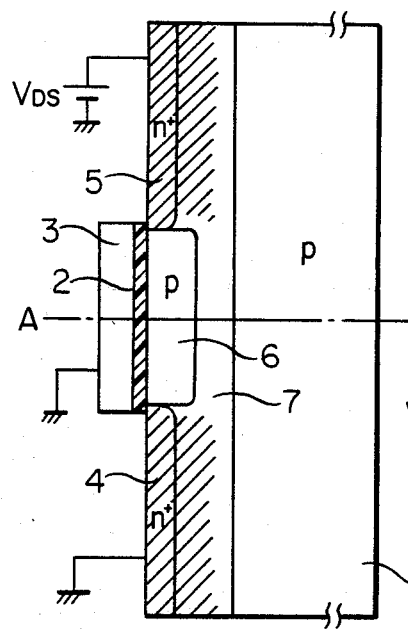
Figure 4B:
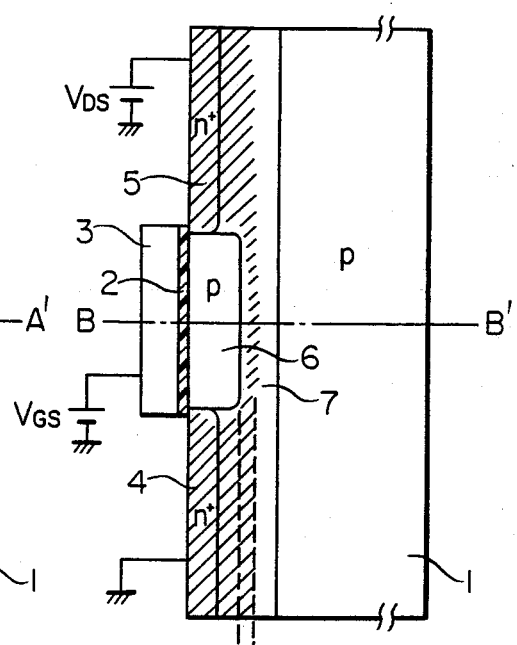
Figure 4C:
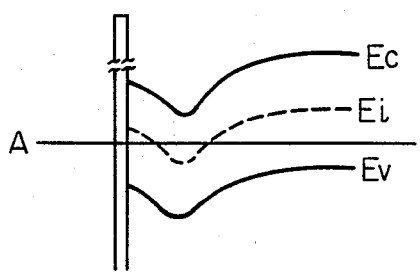
Figure 4D:
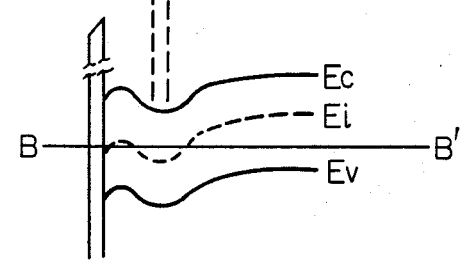
Figure 5A:
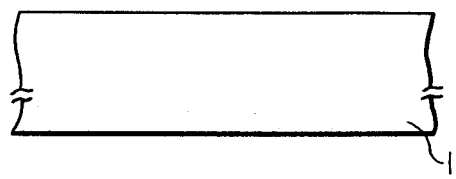
FIGS. 5A to 5F show fabrication steps of the semiconductor device according to the present invention.
Figure 5B:
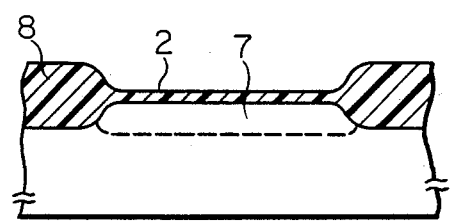
Figure 5C:
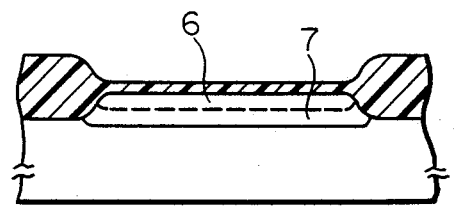
Figure 5D:
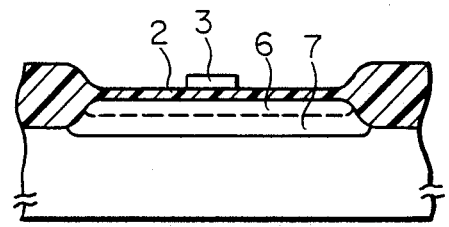
Figure 5E:
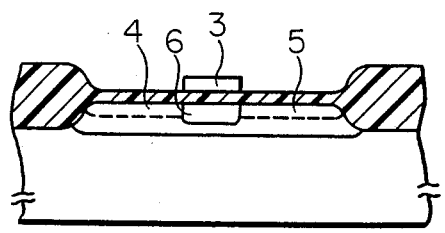
Figure 5F:
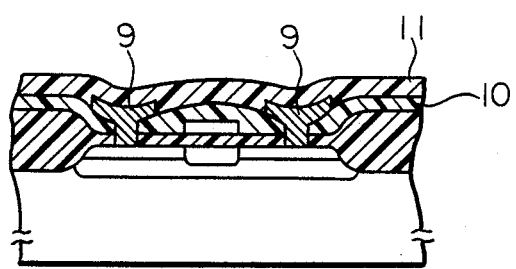

FIGS. 4A to 4D illustrate the operation of the above described MOSFET according to the present invention by referring to the energy band. Shaded regions of FIGS. 4A and 4B represent n-type neutral layers appearing when the MOSFET is respectively in the ON state and in the OFF state, in the same way as FIGS. 3A and 3B. FIGS. 4C and 4D show energy bands along sections A—A' and B—B' of FIGS. 4A and 4B, respectively.

As shown in FIG. 4D, the energy band is flat in the current path portion of the neutral layer formed in the n-type impurity layer 7. The electric field of this portion in the longitudinal direction, i.e., in a direction perpendicular to the current flow, is weak. In this neutral layer, therefore, the drop of carrier movement speed is not large. It is thus possible to allow the flow of a large drain current.

FIGS. 5A to 5F show an example of fabrication process of the MOSFET according to the present invention. The fabrication process will now be sequentially outlined.

(1) The p-type semiconductor substrate 1 having resistivity of 2 Ωcm is prepared.

(2) A LOCOS (localized oxidation of silicon) film layer of 6,000 Å and a gate oxide film 2 of 300 Å are formed. With acceleration voltage of 180 kV and implantation amount of $2 \times 10^{12}$ cm$^{-2}$, phosphor is then ion-implanted to form the n-type impurity layer 7.

(3) With acceleration voltage of 50 kV and implantation amount of $3 \times 10^{12}$ cm$^{-2}$, BF$_2$ is ion-implanted to form the p-type impurity layer 6.

(4) Polycrystal silicon is deposited to form the thickness of 5,000 Å. The deposited silicon undergoes phosphorous treatment to obtain low resistance and is then worked to have a predetermined shape, resulting in the gate 3.

(5) By means of the self alignment system using the gate, arsenic is ion-implanted to form the source 4 and the drain 5.

(6) By means of the photolithography technique, the contact hole is formed and the insulation film between layers 10 is deposited. Thereafter, aluminum which is a wiring material is deposited to have thickness of 8,000 Å and worked to have a wiring shape by the photolithography technique. The electrode 9 is formed. Lastly the passivation film 11 is deposited.

By means of the processing steps heretofore described, the MOSFET according to the present invention explained by referring to FIGS. 2 to 4 can be fabricated.

In the above described MOSFET of a semiconductor device according to an embodiment of the present invention, it is possible to raise the impurity concentration of the p-type impurity layer 6 located between the source 4 and the drain 5 and raise the punch through withstand voltage between the source and the drain. Accordingly, the gate length can be shortened. Further, the n-type impurity layer having a comparatively low concentration is disposed between the p-type semiconductor substrate and the source, drain and the p-type impurity layer 6 disposed between the source and the drain. In the pn junction between the p-type semiconductor substrate and the n-type impurity layer, therefore, the depletion layer is widened largely. The capacitance between the source and the substrate and the capacitance between the drain and the substrate are thus reduced. As a result, the MOSFET according to the present invention has an improved operation speed.

FIG. 6 shows the structure of a MOSFET according to another embodiment of the present invention. In the illustrated MOSFET, a MOSFET having the same structure as that of FIG. 2 is disposed on a substrate 12 having the so-called SOI (Silicon On Insulator) structure in which a monocrystalline silicon film is disposed on an insulation substrate made of sapphire, for example. As this SOI substrate 12, a silicon oxide film formed on silicon may be used.

In the above described embodiments of the present invention, a channel MOSFET is used. By altering the conductivity types of impurities, however, the present invention can be applied to p channel MOSFETs as well.

In the MOSFET according to the present invention as described above, the current flows inside the semiconductor substrate. Therefore, the probability of intrusion of the generated hot carriers into the gate or the insulation layer around the gate is reduced. This results in the prevention of the characteristics from deteriorating significantly even after long time use. Inside the semiconductor substrate, the electric field in the longitudinal direction is small and the scattering between it and the gate insulation film is not significant, unlike the surface of the semiconductor substrate. Accordingly, the movement speed of carriers is not significantly lowered. In the MOSFET according to the present invention, therefore, a large drain current can be allowed to flow. Further, the withstand voltage between the source and drain can be maintained even if the gate length is made minute. In addition, the parasitic capacitance of the source-to-substrate and the drain-to-substrate can be reduced, resulting in a fast operation speed.

What is claimed is:

1. A MOS field-effect transistor comprising:
   a semiconductor substrate of a first conductivity type or an insulator;
   a source, having an upper main surface, comprising an impurity layer of a second conductivity type disposed on said semiconductor substrate or said insulator;
   a drain, having an upper main surface, comprising an impurity layer of the second conductivity type disposed on said semiconductor substrate or said insulator;
   a first impurity layer of the first conductivity type formed between said source and said drain, said first impurity layer having an upper main surface;
   an insulated gate formed on said upper main surface of said first impurity layer of the first conductivity type via an insulation film; and
   a second impurity layer of the second conductivity type having an impurity concentration lower than that of said source and said drain, said second impurity layer of the second conductivity type being disposed between said source, said drain and said first impurity layer of the first conductivity type, and said semiconductor substrate of the first conductivity type or said insulator, wherein said first impurity layer of the first conductivity type has a depth, extending from said upper main surface thereof toward said second impurity layer, which is greater than the depth of said source and drain.

2. A Mos field effect transistor according to claim 1, wherein said semiconductor substrate of the first conductivity type has such a structure that a monocrystalline thin semiconductor film is formed on an insulator substrate.

3. A Mos field-effect transistor, according to claim 1, wherein said first impurity layer has an upper main surface which is planar with the upper main surface of each of said source and drain.

4. A Mos field-effect transistor, according to claim 3, wherein said source and drain are highly-doped with ion-implanted arsenic, said first impurity layer has an ion-implanted impurity concentration of BF$_2$ and said second impurity layer has an ion-implant of phosphor.

5. A Mos field-effect transistor, according to claim 4, comprising a semiconductor substrate of p-type conductivity, source and drain of highly-doped n-type conductivity and wherein said first impurity layer and said second impurity layer are of p-type and n-type conductivity, respectively.

6. A Mos field-effect transistor, according to claim 3, comprising a semiconductor substrate of p-type conductivity, source and drain of highly-doped n-type conductivity and wherein said first impurity layer and said second impurity layer are of p-type and n-type conductivity, respectively.

7. A Mos field-effect transistor, according to claim 1, comprising a semiconductor substrate of p-type conductivity, source and drain of highly-doped n-type conductivity and wherein said first impurity layer and said second impurity layer are of p-type and n-type conductivity, respectively.

8. A Mos field-effect transistor, comprising:
- a semiconductor substrate region of a first conductivity type;
- source and drain regions of a second conductivity type, complementary to said first conductivity type, formed above said semiconductor substrate region;
- a first impurity layer of the first conductivity type formed between said source and drain regions and having side surfaces contiguous with end surfaces of said source and drain regions;
- an insulated gate formed on said first impurity layer through a silicon oxide insulation film; and
- a second impurity layer of the second conductivity type having an impurity concentration lower than said source and drain regions and being formed between a main upper surface of said semiconductor substrate region and a lower surface of said source, drain and first impurity layer, wherein said source region, said drain region and said first impurity layer have respective upper main surfaces that are planar, wherein said first impurity layer has a depth, extending from said upper main surface thereof in the direction of said semiconductor substrate region, which is greater than the depths of said source and drain.

9. A Mos field-effect transistor according to claim 8, wherein said first and second conductivity type are p-type and n-type conductivity, respectively.

10. A Mos field-effect transistor according to claim 8, wherein said first and second conductivity type are m-type and p-type conductivity, respectively.

* * * * *